US011977303B2

(12) United States Patent
Funakoshi et al.

(10) Patent No.: US 11,977,303 B2
(45) Date of Patent: May 7, 2024

(54) DISPLAY DEVICE

(71) Applicant: Japan Display Inc., Tokyo (JP)

(72) Inventors: Hirofumi Funakoshi, Tokyo (JP); Mototaka Eguchi, Tokyo (JP); Tatsunori Muramoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/103,526

(22) Filed: Jan. 31, 2023

(65) Prior Publication Data

US 2023/0288763 A1 Sep. 14, 2023

(30) Foreign Application Priority Data

Feb. 2, 2022 (JP) ................................. 2022-014800

(51) Int. Cl.
*G02F 1/1362* (2006.01)
*H01L 27/12* (2006.01)

(52) U.S. Cl.
CPC .. *G02F 1/136209* (2013.01); *G02F 1/136286* (2013.01); *H01L 27/1248* (2013.01); *H01L 27/124* (2013.01)

(58) Field of Classification Search
CPC .................................................. G02F 1/1362
See application file for complete search history.

(56) References Cited

U.S. PATENT DOCUMENTS

| 5,847,781 | A | 12/1998 | Ono et al. | |
|---|---|---|---|---|
| 2005/0140857 | A1* | 6/2005 | Kim | G02F 1/136209 349/110 |
| 2009/0207362 | A1* | 8/2009 | Nagano | G02F 1/134363 349/139 |
| 2013/0140568 | A1* | 6/2013 | Miyamoto | H01L 27/14632 257/53 |
| 2019/0086720 | A1* | 3/2019 | Yang | G02F 1/136209 |
| 2019/0369450 | A1* | 12/2019 | Tsuchiya | G02F 1/1362 |
| 2020/0142247 | A1* | 5/2020 | Zhao | G02F 1/133504 |
| 2021/0405792 | A1* | 12/2021 | Zhang | G02F 1/13338 |

FOREIGN PATENT DOCUMENTS

JP 2005-091819 A 4/2005

* cited by examiner

*Primary Examiner* — Sang V Nguyen
(74) *Attorney, Agent, or Firm* — Michael Best & Friedrich LLP

(57) ABSTRACT

According to one embodiment, a display device includes, the first substrate including an insulating substrate, first and second light-shielding layers, a stacked layer film, first and second source lines, and a first insulating layer, the second substrate including first and second light-shielding materials. A first width of the first light-shielding layer along the first direction is equal to or greater than a second width of the first light-shielding material along the first direction, and a third width of the second light-shielding layer along the first direction is equal to or greater than a fourth width of the second light-shielding material along the first direction.

11 Claims, 11 Drawing Sheets

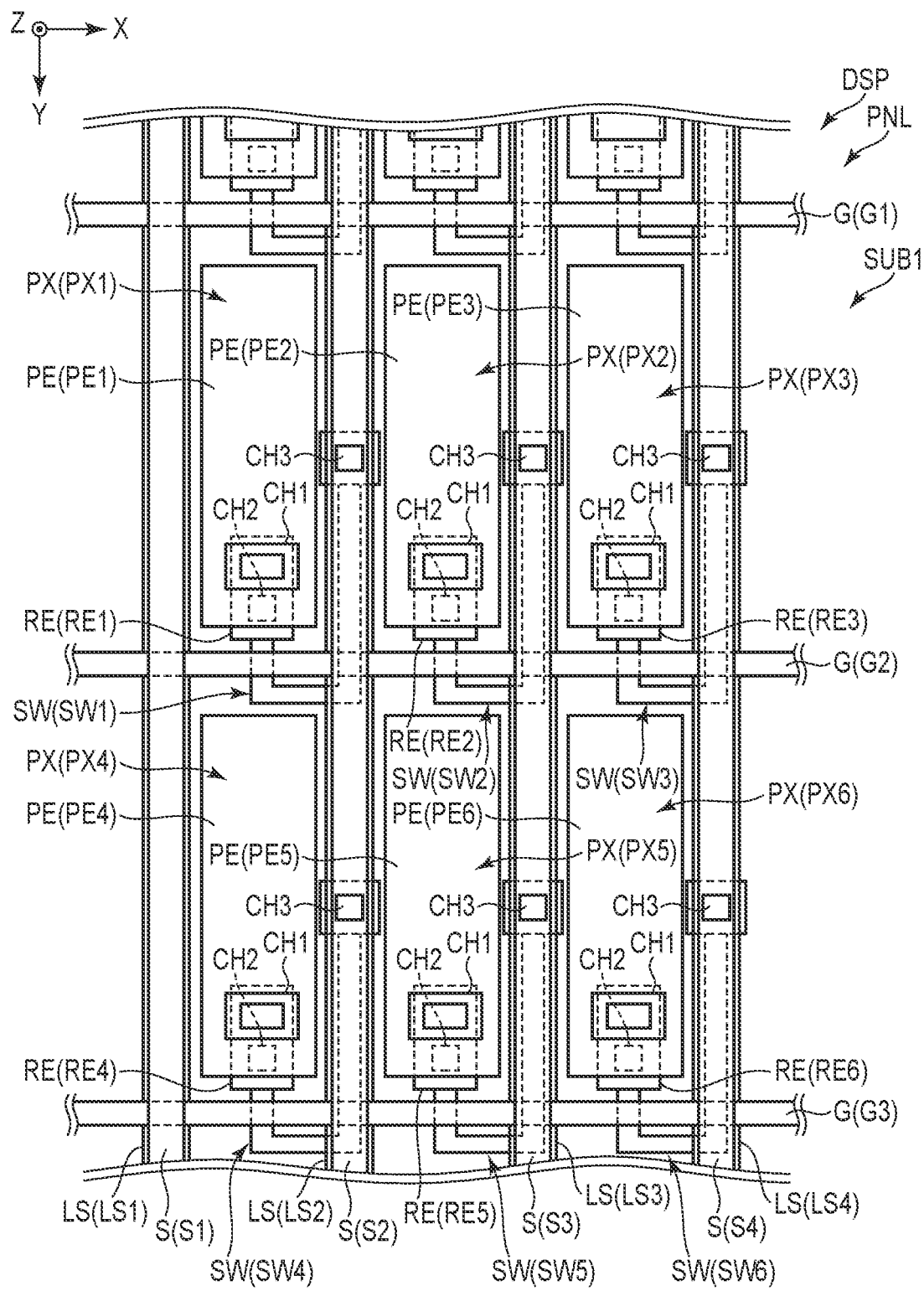
F I G. 2

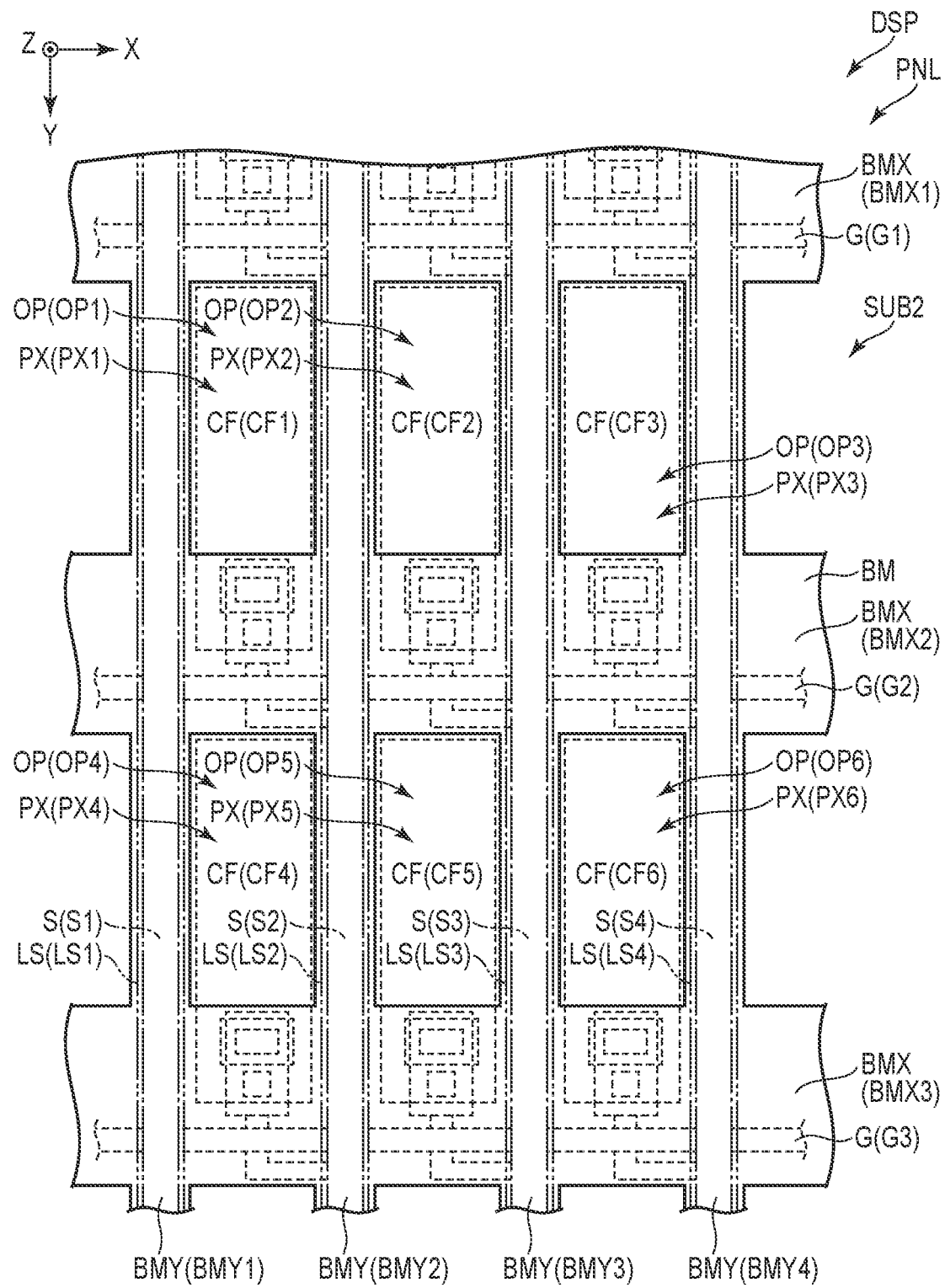
F I G. 3

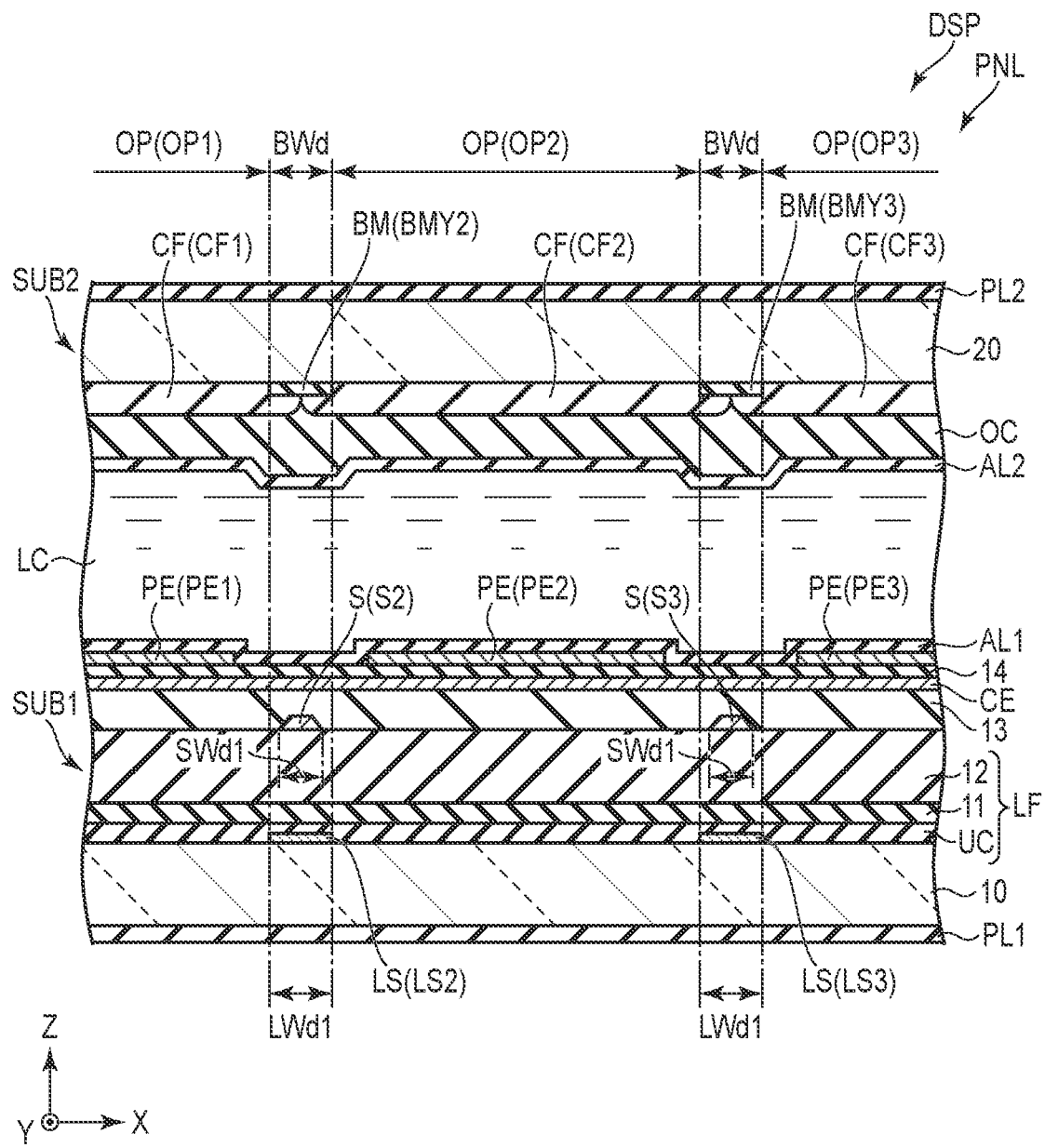
F I G. 4

DISPLAY DEVICE

CROSS-REFERENCE TO RELATED APPLICATIONS

This application is based upon and claims the benefit of priority from Japanese Patent Application No. 2022-014800, filed Feb. 2, 2022, the entire contents of which are incorporated herein by reference.

FIELD

Embodiments described herein relate generally to a display device.

BACKGROUND

Display devices comprise a display panel including a first substrate and a second substrate opposing the first substrate, and an illumination device opposing the display panel from a first substrate side. The first substrate comprises a gate extending along a first direction and a source line extending along a second direction that intersects the first direction. The second substrate comprises a light-shielding material opposing the source line, and the like. Light emitted from the illumination device to the first substrate can be reflected by a side surface of the source line, and the like. When the display device is viewed from a vertical direction with respect to the second substrate, the light reflected by the side surface of the source line and the like, can be shielded by the light-shielding material of the second substrate. When the display device is viewed from an oblique direction with respect to the second substrate, light reflected from the side surface of the source line and the like, may not be shielded. In the case, the contrast when the display device is viewed at an angle may be lowered.

BRIEF DESCRIPTION OF THE DRAWINGS

FIG. 2 is a plan view of an example of a first substrate according to the first embodiment.

FIG. 3 is a plan view of an example of a second substrate according to the first embodiment.

FIG. 4 is a cross-sectional view of an example of a display panel shown in FIGS. 2 and 3.

DETAILED DESCRIPTION

Figure 1:
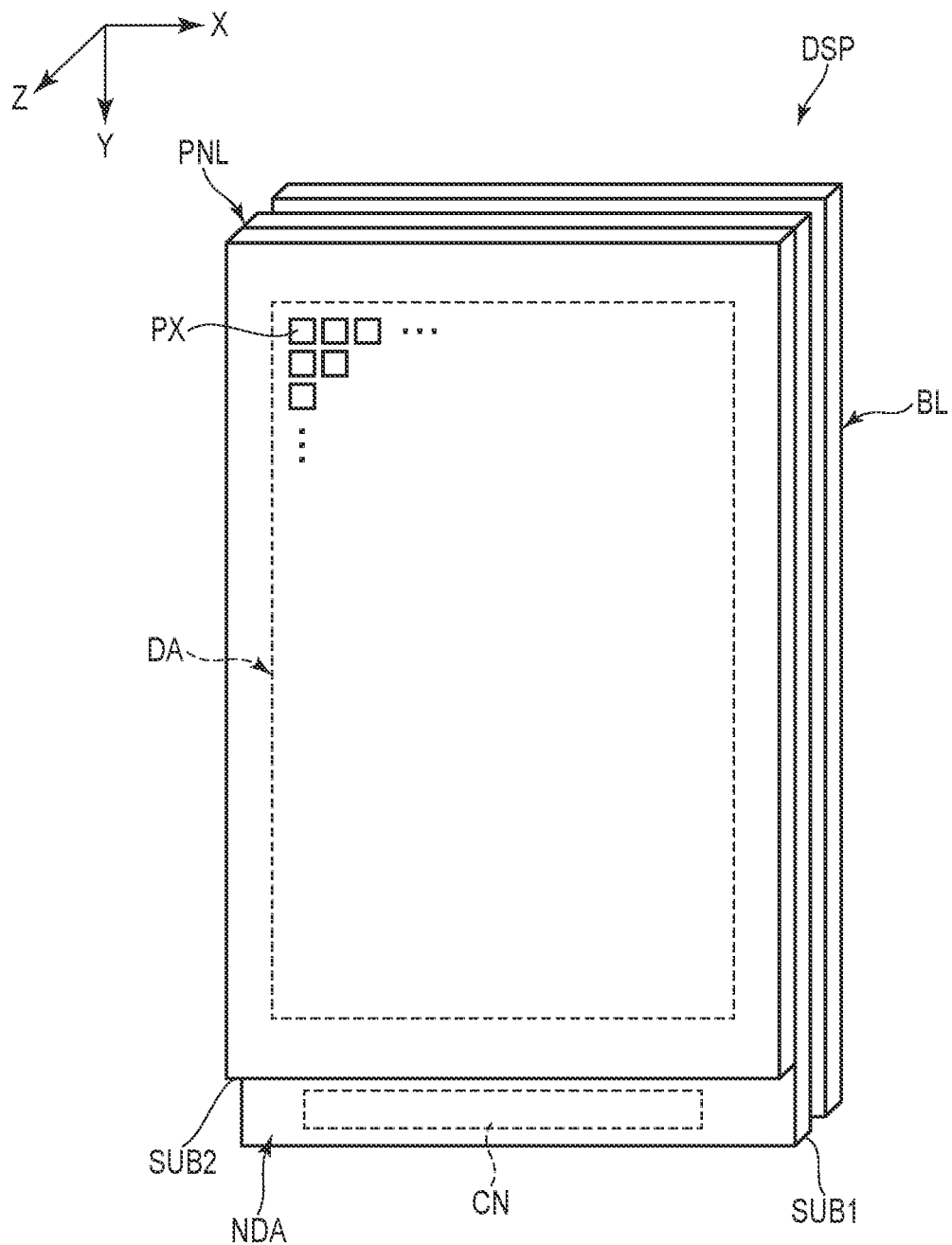
FIG. 1 is a perspective view schematically showing a configuration example of a liquid crystal display device according to the first embodiment.

In general, according to one embodiment, a display device comprising, a first substrate, a second substrate opposing the first substrate, and a liquid crystal layer held between the first substrate and the second substrate, wherein the first substrate includes an insulating substrate, a first light-shielding layer and a second light-shielding layer located above the insulating substrate, a stacked layer film located above the insulating substrate, a first source line and a second source line located above the stacked layer film, and a first insulating layer located above the stacked layer film, the first source line and the second source line, the second substrate includes a first light-shielding material and a second light-shielding material, the first source line and the second source line are disposed to be spaced apart from each other along a first direction, the first light-shielding material and the second light-shielding material are disposed to be spaced apart from each other along the first direction, the first light-shielding layer overlaps the first source line and the first light-shielding material, the second light-shielding layer overlaps the second source line and the second light-shielding material, a first width of the first light-shielding layer along the first direction is equal to or greater than a second width of the first light-shielding material along the first direction, and a third width of the second light-shielding layer along the first direction is equal to or greater than a fourth width of the second light-shielding material along the first direction.

According to another embodiment, a display device comprising, a first substrate, a second substrate opposing the first substrate, and a liquid crystal layer held between the first substrate and the second substrate, wherein the first substrate includes an insulating substrate, a first light-shielding layer and a second light-shielding layer located above the insulating substrate, a first stacked layer film and a second stacked layer film located above the insulating substrate, a first source line located above the first stacked layer film, a second source line located above the second stacked layer film, and a first insulating layer located above the first stacked layer film, the second stacked layer film, the first source line, and the second source line, the second substrate includes a first light-shielding material and a second light-shielding material, the first stacked layer film and the second stacked layer film are disposed to be spaced apart from each other along a first direction, the first light-shielding material and the second light-shielding material are disposed to be spaced apart from each other along the first direction, the first stacked layer film overlaps the first source line and the first light-shielding material, and the second stacked layer film overlaps the second source line and the second light-shielding material.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

In the embodiments, a display device will be described as an example of the electronic devices. Such a display device can be used in various types of devices including, for example, virtual reality (nR) viewers, smartphones, tablet terminals, mobile terminals, personal computers, television receivers, in-vehicle devices, game consoles, wearable terminals and other devices.

First Embodiment

FIG. 1 is a perspective view schematically showing a configuration example of a liquid crystal display device DSP according to the first embodiment. A first direction X, a second direction Y and a third direction Z are orthogonal to each other, but may intersect at an angle other than 90 degrees. The first direction X and the second direction Y correspond to directions parallel to the main surface of the substrate constituting the liquid crystal display device (to referred to simply as "display device" hereinafter) DSP, and the third direction Z corresponds to the thickness direction of the display device DSP. In the following descriptions, a direction from a first substrate SUB1 towards a second substrate SUB2 is referred to as "upper side" (or simply "above") and a direction from the second substrate SUB2 towards the first substrate SUB1 is referred to as "lower side" (or simply "below"). With such expressions "a second member above a first member" and "a second member below a first member", the second member may be in contact with the first member or may be remote from the first member. In addition, it is assumed that there is an observation position to observe the display device DSP on a tip side of an arrow in the third direction Z, and viewing from this observation position toward an X-Y plane defined by the first direction X and the second direction Y is referred to as a plan view. Further, a "width (or length) of a given substance, object, space or area in the first direction X" may be referred to as a "horizontal width" and a "width (or length) of a given substance, object, space, or area along the second direction Y" may be referred to as a "longitudinal width".

The display device DSP comprises a display panel PNL and an illumination device BL opposing the display panel PNL. In the example illustrated in FIG. 1, the display device DSP is formed into a rectangular shape in plan view. The display device DSP may be formed into a shape other than a rectangular shape. For example, the display device DSP may be formed into a round, circular, or oval shape or the like, which may be formed by shaping the corners of the rectangular shape in a round shape. Short sides of the display device DSP extend along the first direction X, and long sides of the display device DSP extend along the second direction Y. The long sides of the display device DSP may extend along the first direction X, and the short sides of the display device DSP may extend along the second direction Y.

The display panel PNL comprises a first substrate SUB1 and a second substrate SUB2 opposing each other, and a display functional layer (in this embodiment, a liquid crystal layer LC, to be described later) held between the first substrate SUB1 and the second substrate SUB2. The display panel PNL includes a display area DA and a non-display area NDA. The display area DA is an area which displays images. The display area DA is located approximately in the center of the area where the first substrate SUB1 and the second substrate SUB2 oppose each other. The non-display area NDA is the area where images are not displayed and is located on an outer side of the display area DA. The display panel PNL, for example, comprises a plurality of pixels PX arranged in a matrix on the X-Y plane in the display area DA.

The first substrate SUB1 comprises a connection portion CN in the non-display area NDA which does not oppose the second substrate SUB2. The connection portion CN comprises terminals for connecting a flexible printed wiring board and signal supply sources such as IC chips.

The illumination device BL is disposed on a rear side of the first substrate SUB1(, which is an opposite side to the opposing surface of the second substrate SUB2). As such an illumination device BL, various modes are applicable. For example, the illumination device BL comprises a light guide opposing the first substrate SUB1, a light source such as a plurality of light-emitting diodes (LEDs) arranged along an end portion of the light guide, a reflective sheet disposed on one main surface side of the light guide, various types of optical sheets stacked on the other main surface side of the light guide.

Note that the display panel PNL in the example illustrated here is a transmissive type that displays images by selectively transmitting light from the illumination device BL, but it is not limited to this type. For example, the display panel PNL may be of a reflective type that displays images by selectively reflecting light from external light or light from an external light source, or it may be a trans-reflective type that has display functions of both the transmissive and reflective types.

Although descriptions of the detailed configuration of the display panel PNL will be omitted here, any of the following display modes can be applied: a display mode utilizing a longitudinal electric field along a normal line of the display panel PNL; a display mode utilizing an inclined electric field inclined at an angle to the normal line of the display panel PNL, and a display mode utilizing a lateral electric field along the main surface of the display panel PNL.

FIG. 2 is a plan view of an example of the first substrate according to this embodiment. FIG. 2 shows the main part of the first substrate SUB1. Here, a configuration example will be described, in which one of the display modes which utilize a lateral electric field, namely, a fringe field switching (FFS) mode is applied.

The first substrate SUB1 comprises a plurality of scanning lines (gate lines) G (G1, G2, G3, . . . ), a plurality of signal lines (source lines) S (S1, S2, S3, S4, . . . ), pixel electrodes PE (PE1, PE2, PE3, PE4, PE5, PE6, . . . ), relay electrodes RE (RE1, RE2, RE3, RE4, RE5, RE6, . . . ), switching elements SW (SW1, SW2, SW3, SW4, SW5, SW6, . . . ) and a plurality of light-shielding layers LS (LS1, LS2, LS3, LS4, . . . ) and the like. Note that, for example, the first substrate SUB1 comprises a common electrode CE, but the illustration of the common electrode CE is omitted from FIG. 2.

The gate lines G (G1, G2, G3, . . . ) are aligned along the second direction Y at predetermined intervals. The gate lines G (G1, G2, G3, . . . ) each extend along the first direction X. The gate lines G (G1, G2, G3, . . . ) may extend linearly along the first direction X or may be bent. The gate lines G (G1, G2, G3, . . . ) are formed of a metal material such as aluminum (Al), titanium (Ti), silver (Ag), molybdenum (Mo), tungsten (W), copper (Cu) or chromium (Cr) or an alloy of any combination of these metal materials or the like, and the material may be of a single-layer structure or a multilayer structure. For example, the gate lines G (G1, G2, G3, . . . ) are each made from a molybdenum-tungsten alloy film.

The source lines S (S1, S2, S3, S4, . . . ) are aligned along the first direction X at predetermined intervals. The source lines S (S1, S2, S3, S4, . . . ) each extend along the second direction Y. The source lines S (S1, S2, S3, S4, . . . ) may extend linearly along the second direction Y or may be bent. The source lines S (S1, S2, S3, S4, . . . ) are each formed of a metal material such as aluminum (Al), titanium (Ti), silver (Ag), molybdenum (Mo), tungsten (W), copper (Cu) or chromium (Cr) or an alloy of any combination of these metal materials, or the like, and the material may be of a single-layer structure or a multilayer structure. For example, the source lines S (S1, S2, S3, S4, . . . ) are each made from a three-layer stacked layer film of titanium, aluminum and titanium.

For example, pixels PX (PX1, PX2, PX3, PX4, PX5, PX6, . . . ) correspond to regions enclosed by gate lines G and source lines S, respectively. In the drawing, each pixel PX corresponds to a region compartmentalized by each adjacent pair of gate lines and each respective adjacent pair of source lines. When viewed in plan view, the shape of each pixel PX is, for example, rectangular, with the length along the first direction X being shorter than the length along the second direction Y. When viewed in plan view, the shape of the pixel PX is not limited to a rectangular shape, but can be changed as appropriate. In the example illustrated, a pixel PX1 corresponds to the region of a square formed by gate lines G1 and G2 and source lines S1 and S2. A pixel PX2 corresponds to the region of a square formed by gate lines G1 and G2 and source lines S2 and S3. A pixel PX3 corresponds to the region of a square formed by gate lines G1 and G2 and source lines S3 and S4. A pixel PX4 corresponds to the region of a square formed by gate lines G2 and G3 and source lines S1 and S2. A pixel PX5 corresponds to the region of a square formed by gate lines G2 and G3 and source lines S2 and S3. A pixel PX6 corresponds to the region of a square formed by gate lines G2 and G3 and source lines S5 and S6.

The pixel electrodes PE (PE1, PE2, PE3, PE4, PE5, PE6, . . . ) are disposed respectively in the pixels PX (PX1, PX2, PX3, PX4, PX5, PX6, . . . ). In the drawing, the pixel electrodes PE are each disposed in the region surrounded by each adjacent pair of gate lines G and each respective adjacent pair of source lines S. The pixel electrodes PE (PE1, PE2, PE3, PE4, PE5, PE6, . . . ) are electrically connected to the relay electrodes RE (RE1, RE2, RE3, RE4, RE5, RE6, . . . ), respectively, via contact holes CH1. To the pixel electrodes PE, potentials corresponding to the image signals are applied. For example, the pixel electrodes PE are at potentials different from that of the common electrode CE. In the example illustrated, the pixel electrodes PE are each formed in a rectangular shape whose length along the second direction Y is longer than the length along the first direction X. Note that the pixel electrodes PE may be formed into a shape other than a rectangular shape whose length along the second direction Y is longer than the length along the first direction X. The pixel electrodes PE are formed of the same transparent conductive material as that of the common electrode CE. Note that it suffices if the pixel electrodes PE need be transparent only in the portion overlapping the region contributing to the display, and the other region may be formed of a non-transparent material.

In the example illustrated in FIG. 2, the pixel electrodes PE include pixel electrodes PE1, PE2, PE3, PE4, PE5 and PE6. In the drawings, the pixel electrode PE1 is located in the pixel PX1. The pixel electrode PE1 is disposed in the region surrounded by two adjacent gate lines G1 and G2 and two adjacent source lines S1 and S2. The pixel electrode PE1 is electrically connected to the relay electrode RE1 via the respective contact hole CH1. The relay electrode RE1 is electrically connected to the switching element SW1. In the drawing, the pixel electrode PE2 is disposed in the pixel PX2. The pixel electrode PE2 is located in the region surrounded by two adjacent gate lines G1 and G2 and two adjacent source lines S2 and S3. The pixel electrode PE2 is electrically connected to the relay electrode RE2 via the respective contact hole CH1. The relay electrode RE2 is electrically connected to the switching element SW2. In the drawing, the pixel electrode PE3 is disposed in the pixel PX3. The pixel electrode PE3 is located in the region surrounded by two adjacent gate lines G1 and G2 and two adjacent source lines S3 and S4. The pixel electrode PE3 is electrically connected to the relay electrode RE3 via the respective contact hole CH1. The relay electrode RE3 is electrically connected to the switching element SW3. In the drawing, the pixel electrode PE4 is disposed in the pixel PX4. The pixel electrode PE4 is located in the region surrounded by two adjacent gate lines G2 and G3 and two adjacent source lines S1 and S2. The pixel electrode PE4 is electrically connected to the relay electrode RE4 via the respective contact hole CH1. The relay electrode RE4 is electrically connected to the switching element SW4. In the drawing, the pixel electrode PE5 is disposed in the pixel PX5. The pixel electrode PE5 is disposed in the region surrounded by two adjacent gate lines G2 and G3 and two adjacent source lines S2 and S3. The pixel electrode PE5 is electrically connected to the relay electrode RE5 via the respective contact hole CH1. The relay electrode RE5 is electrically connected to the switching element SW5. In the drawing, the pixel electrode PE6 is disposed in the pixel PX6. The pixel electrode PE6 is located in the region surrounded by two adjacent gate lines G2 and G3 and two adjacent source lines S3 and S4. The pixel electrode PE6 is electrically connected to the relay electrode RE6 via the respective contact hole CH1. The relay electrode RE6 is electrically connected to the switching element SW6.

The relay electrodes RE (RE1, RE2, RE3, RE4, RE5, RE6, . . . ) are electrically connected to the switching elements SW (SW1, SW2, SW3, SW4, SW5, SW6, . . . ) respectively via contact holes CH2. The contact holes CH2 illustrated in the drawing are each a contact hole for electrically connecting a relay electrode RE and a respective switching element SW to each other. The relay electrodes RE are each formed, for example, of the same material as that of the source lines S. For example, the relay electrodes RE may be formed of a material different from that of the source lines S.

In the example illustrated in FIG. 2, the relay electrodes RE include relay electrodes RE1, RE2, RE3, RE4, RE5 and RE6. The relay electrode RE1 is electrically connected to the switching element SW1 via the respective contact hole CH2. The relay electrode RE2 is electrically connected to the switching element SW2 via the respective contact hole CH2. The relay electrode RE3 is electrically connected to the switching element SW3 via the respective contact hole CH2. The relay electrode RE4 is electrically connected to the switching element SW4 via the respective contact hole CH2. The relay electrode RE5 is electrically connected to the switching element SW5 via the respective contact hole CH2. The relay electrode RE6 is electrically connected to the switching element SW6 via the respective contact hole CH2.

The switching elements SW are each electrically connected to the respective relay electrode RE and the respective source line S. The switching elements SW area electrically connected to the source lines S respectively via contact holes CH3. The contact holes CH3 illustrated in the drawing are each a contact hole for electrically connecting a switching element SW and a respective source line S to each other. The switching elements SW may include a relay electrode RE.

In the example illustrated in FIG. 2, the switching elements SW include switching elements SW1, SW2, SW3, SW4, SW5 and SW6. The switching element SW1 is electrically connected to the relay electrode RE1 and the source line S2. The switching element SW1 is electrically connected to the source line S2 via the respective contact hole CH3. The switching element SW2 is electrically connected to the relay electrode RE2 and the source line S3. The switching element SW2 is electrically connected to the source line S3 via the respective contact hole CH3. The switching element SW3 is electrically connected to the relay electrode RE3 and the source line S4. The switching element SW3 is electrically connected to the source line S4 via the respective contact hole CH3. The switching element SW4 is electrically connected to the relay electrode RE4 and the source line S2. The switching element SW4 is electrically connected to the source line S2 via the respective contact hole CH3. The switching element SW5 is electrically connected to the relay electrode RE5 and the source line S3. The switching element SW5 is electrically connected to the source line S3 via the respective contact hole CH3. The switching element SW6 is electrically connected to the relay electrode RE6 and the source line S4. The switching element SW6 is electrically connected to the source line S4 via the respective contact hole CH3.

The light-shielding layers LS (LS1, LS2, LS3, LS4, . . . ) are aligned along the first direction X at predetermined intervals. The light-shielding layers LS (LS1, LS2, LS3, . . . ) each extend in the second direction Y along the source lines S (S1, S2, S3, S4, . . . ), respectively. Note that the light-shielding layers LS may extend in the first direction X along the plurality of gate lines G (G1, G2, G3, . . . ), respectively. The light-shielding layers LS may each extend linearly or may be bent. The light-shielding layers LS overlap on the source lines S, respectively. The light-shielding layers LS may overlap the gate lines G, respectively. The light-shielding layers LS are formed of a light-shielding material. For example, the light-shielding layers LS are formed of a molybdenum-tungsten alloy.

In the example illustrated in FIG. 2, the light-shielding layers LS include light-shielding layers LS1, LS2, LS3 and LS4. The light-shielding layer LS1 extends in the second direction Y along the source line S1. The light-shielding layer LS1 overlaps the source line S1. The light-shielding layer LS2 extends in the second direction Y along the source line S2. The light-shielding layer LS2 overlaps the source line S2. The light-shielding layer LS3 extends in the second direction Y along the source line S3. The light-shielding layer LS3 overlaps the source line S3. The light-shielding layer LS4 extends in the second direction Y along the source line S4. The light-shielding layer LS4 overlaps the source line S4.

FIG. 3 is a plan view of an example of the second substrate SUB2 according to this embodiment. Here, the main part of the first substrate SUB1 shown in FIG. 2 is indicated by dotted lines.

The second substrate SUB2 has a light-shielding layer (a light-shielding material or black matrix) BM, color filters CF and the like.

The light-shielding layer BM is formed into a lattice pattern. Note that the light-shielding layer BM may have a configuration other than a lattice shape, such as a ladder shape or stripe shape. In the example illustrated in FIG. 3, the light-shielding layer BM includes a plurality of longitudinal portions BMY and a plurality of horizontal portions BMX. The longitudinal portions BMY are aligned along the first direction X at intervals. The longitudinal portions BMY extend along the second direction Y. The longitudinal portions BMY are each formed as a stripe shape having substantially a constant width along the first direction X. Note that the longitudinal portions BMY may not be formed as a stripe shape having substantially a constant width along the first direction X. The longitudinal portions BMY overlap the source lines S and the light-shielding layers LS, respectively. In the example illustrated in FIG. 3, the longitudinal portions BMY include longitudinal portions BMY1, BMY2, BMY3 and BMY4. The longitudinal portion BMY1 overlaps the source line S1 and the light-shielding layer LS1. The longitudinal portion BMY2 overlaps the source line S2 and the light-shielding layer LS2. The longitudinal portion BMY3 overlaps the source line S3 and the light-shielding layer LS3. The longitudinal portion BMY4 overlaps the source line S4 and the light-shielding layer LS4. The horizontal portions BMX are aligned along the second direction Y at intervals. The horizontal portions BMX extend along the first direction X. The horizontal portions BMX are each formed into a stripe portion having substantially a constant width along the second direction Y. Note that the horizontal portions BMX may not be formed into a stripe shape having substantially a constant width along the second direction Y. The horizontal portions BMX overlap the gate lines G, respectively. In the example illustrated in FIG. 3, the horizontal portions BMX include horizontal portions BMX1, BMX2 and BMX3. The horizontal portion BMX1 overlaps the gate line G1. The horizontal portion BMX2 overlaps the gate line G2. The horizontal portion BMX3 overlaps the gate line G3. The longitudinal width of the horizontal portions BMX along the second direction Y is greater than or equal to the longitudinal width of the gate lines G along the second direction Y. The longitudinal width of the horizontal portions BMX along the second direction Y has a width that covers, for example, the respective gate line G, the respective relay electrode RE and the respective switching element SW. The longitudinal width of the horizontal portions BMX may not have a width that covers the gate line G, the relay electrode RE and the switching element SW. The longitudinal portions BMY and the horizontal portions BMX intersect each other respectively when viewed in plan view. In the example illustrated in FIG. 3, the longitudinal portions BMY and the horizontal portions BMX intersect each other in a cross fashion when viewed in plan view. Note that the longitudinal portions BMY and the horizontal portions BMX may intersect in a state other than a cross fashion when viewed in plan view.

The openings OP are regions that are compartmentalized by the light-shielding layers BM and contributes to the display. The openings OP are arranged in a matrix on the X-Y plane. For example, the openings OP include openings OP1, OP2, OP3, OP4, OP5 and OP6. In the example illustrated in FIG. 3, the opening OP1 corresponds to the region surrounded by longitudinal portions BMY1 and BMY2 and horizontal portions BMX1 and BMX2. The opening OP1 opposes the pixel PX1. The opening OP2 corresponds to the region surrounded by longitudinal portions BMY2 and BMY3 and horizontal portions BMX1 and BMX2. The opening OP2 opposes the pixel PX2. The opening OP3 corresponds to the region surrounded by longitudinal portions BMY3 and BMY4 and horizontal portions BMX1 and BMX2. The opening OP3 opposes the pixel PX3. The opening OP4 corresponds to the region surrounded by longitudinal portions BMY1 and BMY2 and horizontal portions BMX2 and BMX3. The opening OP4 opposes the pixel PX4. The opening OP5 corresponds to the region surrounded by longitudinal portions BMY2 and BMY3 and horizontal portions BMX2 and BMX3. The opening OP5 opposes the pixel PX5. The opening OP6 corresponds to the region surrounded by longitudinal portions BMY3 and BMY4 and horizontal portions BMX2 and BMX3. The opening OP6 opposes the pixel PX6.

The color filters CF are provided to overlap the openings OP, respectively. The color filters CF include a first color filter, a second color filter, and a third color filter. The first color, the second color and the third color are colors different from each other. The color filters CF may include a fourth color filter that is different from the first color, second color or third color. The first color filter is, for example, a red color filter, the second color filter is, for example, a green color filter, and the third color filter is, for example, a blue color filter. Note that the fourth color filter is, for example, a white color filter.

In the example illustrated in FIG. 3, the color filters CF include color filters CF1, CF2, CF3, CF4, CF5 and CF6. The color filters CF1 to CF6 are the first color filters, the second color filters or the third color filters. The color filters CF1 to CF6 may be the first color filters, second color filters, third color filters, or fourth color filters. The color filter CF1 is provided in the opening OP1. The color filter CF2 is provided in the opening OP2. The color filter CF3 is provided in the opening OP3. The color filter CF4 is provided in the opening OP4. The color filter CF5 is provided in the opening OP5. The color filter CF6 is provided in the opening OP6.

FIG. 4 is a cross-sectional view showing an example of the display panel PNL shown in FIGS. 2 and 3.

The first substrate SUB1 comprises an insulating substrate 10, an undercoat layer UC, insulating layers 11, 12, 13 and 14, source lines S (S2 and S3), a common electrode CE, pixel electrodes PE (PE1, PE2 and PE3), light-shielding layers LS (LS2 and LS3), an alignment film AL1 and the like. The insulating layers 11 to 14 may have a single-layer or multilayer structure. The first substrate SUB1 may include layers other than the insulating substrate 10, the undercoat layer UC, the insulating layers 11, 12, 13 and 14, the source lines S (S2 and S3), the common electrode CE, the pixel electrodes PE (PE1, PE2 and PE3), the light-shielding layers LS (LS2 and LS3), or the alignment film AL1. The first substrate SUB1 may not include at least one layer of the insulating substrate 10, the undercoat layer UC, the insulating layers 11, 12, 13 and 14, the source lines S (S2 and S3), the common electrode CE, the pixel electrodes PE (PE1, PE2 and PE3), the light-shielding layers LS (LS2 and LS3) and the alignment film AL1. Under the insulating substrate 10, a polarizer PL1 is provided. The undercoat layer UC, the insulating layer 11, and the insulating layer 12 may be expressed as a stacked layer film LF.

The insulating substrate 10 is transparent and, for example, is formed of glass such as borosilicate glass, but may as well be formed of plastic or some other resin.

The undercoat layer UC is located on the insulating substrate 10. The undercoat layer UC is formed of an insulating material. The undercoat layer UC may be of a single-layer structure or a multilayer structure. For example, the undercoat layer UC includes a silicon nitride film and a silicon oxide film.

The insulating layers 11 to 14 are all transparent. The insulating layers 11, 12 and 14 are inorganic insulating films. For example, the insulating layers 11, 12 and 14 are formed of silicon nitride or silicon oxide. Further, the insulating layer 11 may as well be tetraethoxysilane (TEOS). The insulating layer 13 is an organic insulating film. For example, the insulating layer 13 is formed of a resin such as acrylic resin. The insulating layer 11 is located on the undercoat layer UC. The insulating layer 12 is located on the insulating layer 11. The insulating layer 13 is located on the insulating layer 12. The insulating layer 14 is located on the insulating layer 12 and the common electrode CE.

The source lines S (S2 and S3) are located on the insulating layer 12. In other words, the source lines S are located between the insulating layers 12 and 13. The source lines S2 and S3 are located on the insulating layer 12 so as to be spaced apart from each other along the first direction X. The horizontal width SWd1 of the source lines S (S2 and S3) along the first direction X is less than or equal to the horizontal width BWd of the light-shielding layers BM along the first direction X. For example, the horizontal width SWd1 of the source lines S is 2.5 µm. The horizontal width of the source lines S2 and S3 may be less than or equal to 2.5 µm or greater than 2.5 µm. The widths of the source lines S2 and S3 may be different from each other.

The common electrode CE is located on the insulating layer 13. In other words, the common electrode CE is located between the insulating layers 13 and 14. The common electrode CE extends over multiple pixel electrodes PE. For example, the common electrode CE is formed of a transparent conductive material such as of indium tin oxide (ITO), indium zinc oxide (IZO), or indium gallium oxide (IGO). Note that the common electrode CE need only be transparent in the portion overlapping the region that contributes to the display. The other portions may be formed of non-transparent materials.

The pixel electrodes PE (PE1, PE2 and PE3) are located on the insulating layer 14. The pixel electrodes PE1, PE2 and PE3 are located on the insulating layer 14 so as to be spaced apart from each other along the first direction X.

The light-shielding layers LS (LS2 and LS3) are located on the insulating substrate 10. In other words, the light-shielding layers LS are located between the insulating substrate 10 and the undercoat layer UC. The light-shielding layers LS2 and LS3 are located on the insulating substrate 10 so as to be spaced apart from each other along the first direction X. The light-shielding layers LS are located directly below the source lines S. In other words, the light-shielding layers LS overlap the source lines S, respectively. In the example illustrated in FIG. 4, the light-shielding layer LS2 is located directly under the source line S2 and the light-shielding layer LS3 is located directly under the source line S3. In other words, the light-shielding layer LS2 overlaps the source line S2 and the light-shielding layer LS3 overlaps the source line S3. The horizontal width LWd1 of the light-shielding layers LS (LS2 and LS3) along the first direction X is greater than or equal to the horizontal width BWd of the light-shielding layers BM. In other words, the horizontal width LWd1 of the light-shielding layers LS (LS2 and LS3) is greater than or equal to the horizontal width SWd1 of the source lines S. For example, the horizontal width LWd1 of the light-shielding layers LS is twice or more the width SWd1 of the source line S. For example, the horizontal width LWd1 of the light-shielding layers LS is 5.0 µm to 9.0 µm. For example, the horizontal width LWd1 of the light-shielding layers LS is 5.0 µm. In other words, for example, the horizontal width LWd1 of the light-shielding layers LS is the same as the horizontal width BWd of the light-shielding layers BM.

The alignment film AL1 covers the insulating layer 14 and the pixel electrodes PE. The alignment film AL1 is a polyimide film subjected to an alignment treatment.

The liquid crystal layer LC is located above the first substrate SUB1 and below the second substrate SUB2. In other words, the liquid crystal layer LC is located between the first substrate SUB1 and the second substrate SUB2. The liquid crystal layer LC may be a positive type having a positive dielectric constant anisotropy or a negative type having a negative dielectric constant anisotropy.

The second substrate SUB2 is located above the first substrate SUB1 and the liquid crystal layer LC. The second substrate SUB2 comprises an insulating substrate 20, a light-shielding layer BM, color filters CF, an overcoat layer OC, an alignment film AL2 and the like. The second substrate SUB2 may include layers other than the insulating substrate 20, the overcoat layer OC, the color filters CF, the light-shielding layer BM and the alignment film AL2. The second substrate SUB2 may not include at least one layer of the insulating substrate 20, the overcoat layer OC, the color filter CF, the light-shielding layer BM and the alignment film AL2. On the insulating substrate 20, the polarizer PL2 is provided. The absorption axes of the polarizer PL1 and the polarizer PL2 are set to be orthogonal to each other when viewed in plan view.

The insulating substrate 20 is transparent and, example, is formed of glass such as borosilicate glass, but may as well be formed of plastic or other resin.

The light-shielding layer BM is located under the insulating substrate 20. The light-shielding layers BMY2 and BMY3 are located under the insulating substrate 20 so as to be spaced apart from each other along the first direction X. The light-shielding layers BM (BMY2 and BMY3) are located directly above the source lines S (S2 and S3) and the light-shielding layers LS (LS2 and LS3), respectively. In other words, the light-shielding layers BM overlap the source lines S and the light-shielding layers LS, respectively. In the example illustrated in FIG. 4, the light-shielding layer BMY2 is located directly above the source line S2 and the light-shielding layer LS2, and the light-shielding layer BMY3 is located directly above the source line S3 and the light-shielding layer LS3. In other words, the light-shielding layer BMY2 overlaps the source line S2 and the light-shielding layer LS2, and the light-shielding layer BMY3 overlaps the source line S3 and the light-shielding layer LS3. The horizontal width BWd of the light-shielding layers BMY (BMY2 and BMY3) is greater than or equal to the horizontal width SWd1 of the source lines S. For example, the horizontal width BWd of the light-shielding layers BMY (BMY2 and BMY3) is 5.0 μm.

The color filters CF are located under the insulating substrate 20 and the light-shielding layers BM. In the example illustrated in FIG. 4, the color filter CF1 covers a part of the light-shielding layer BMY2. The color filter CF1 opposes the pixel electrode PE1. The color filter CF2 covers a part of the light-shielding layer BMY2 and a part of the light-shielding layer BMY3. The color filter CF2 opposes the pixel electrode PE2. The color filter CF3 covers a part of the light-shielding layer BMY3. The color filter CF3 opposes the pixel electrode PE3. The color filter CF may be placed on the first substrate SUB1. The color filter CF may not be placed.

The overcoat layer OC is located under the color filters CF. The overcoat layer OC is a transparent insulating layer. The overcoat layer OC may include a portion corresponding to the light-shielding layer BM, which protrudes downward. For example, the overcoat layer OC may include a portion corresponding to the light-shielding layer BMY2, which protrudes downward and a portion corresponding to the light-shielding layer BMY3, which protrudes downward. Nota that the overcoat layer OC may not have the portion corresponding to the light-shielding layer BMY2 protruding downward, or the portion corresponding to the light-shielding layer BMY3 protruding downward.

The alignment film AL2 covers the overcoat layer OC. The alignment film AL2 is a polyimide film subjected to an alignment treatment.

The alignment films AL1 and AL2 are, for example, horizontally aligned films with an alignment restriction force approximately parallel to the X-Y plane. The alignment restriction force may be imparted by a rubbing process or by a photo-alignment process.

According to this embodiment, the display device DSP includes a first substrate SUB1 and a second substrate SUB2 opposing each other and a liquid crystal layer LC held between the first substrate SUB1 and the second substrate SUB2. The first substrate SUB1 comprises an insulating substrate 10, an undercoat layer UC, insulating layers 11 to 14, source lines S, a common electrode CE, pixel electrodes PE, light-shielding layers LS, an alignment film AL1 and the like. The light-shielding layer LS is located on the insulating substrate 10. The undercoat layer UC is located above the light-shielding layer LS and the insulating substrate 10. In other words, the undercoat layer UC covers the light-shielding layers LS and the insulating substrate 10. The insulating layer 11 is located on the undercoat layer UC. The insulating layer 12 is located on the insulating layer 11. The source lines S are located on the insulating layer 12. The insulating layer 13 is located on the source lines S and the insulating layer 12. In other words, the insulating layer 13 covers the source lines S and the insulating layer 12. The second substrate SUB2 comprises an insulating substrate 20, light-shielding layers BM, color filters CF, an overcoat layer OC, an alignment film AL2 and the like. The light-shielding layers BM are located under the insulating substrate 20. The color filters CF are located under the light-shielding layers BM and the insulating substrate 20. In other words, the color filters CF cover the light-shielding layers BM and the insulating substrate 20. The overcoat layer OC is located under the color filters CF. The light-shielding layers LS overlap the source lines S and the light-shielding layers BM, respectively. In other words, the light-shielding layers LS oppose the source lines S and the light-shielding layers BM, respectively. The horizontal width BWd of the light-shielding layers BMY is greater than or equal to the horizontal width SWd1 of the source lines S. For example, the horizontal width BWd of the light-shielding layers BMY is 5.0 μm. For example, the horizontal width BWd of the source lines S is 2.5 μm. The horizontal width LWd1 of the light-shielding layers LS is greater than or equal to the horizontal width SWd1 of the source lines S. For example, the horizontal width LWd1 of the light-shielding layers LS is 5.0 μm. In other words, for example, the horizontal width LWd1 of the light-shielding layers LS is the same as the horizontal width BWd of the light-shielding layers BM. The light-shielding layers LS prevent the reflection of light on the side surfaces of the source lines S. That is, the light-shielding layers LS prevent stray light beams from being generated by the side surfaces of the source lines S. Therefore, the display device DSP of this embodiment can reduce the utilization rate of black color (black transmittance) when viewed obliquely at an angle. That is, the display device DSP of this embodiment can improve the contrast when viewed at an angle. Therefore, it is possible to provide a display device that can improve the display quality.

Next, display devices for other embodiments and modified examples of this embodiment will be described. In the other embodiments and modified examples of this embodiment described below, parts identical to those of the first embodiment provided above will be denoted by the same reference symbols and the detailed descriptions therefor will be omitted, and the detailed descriptions will focus on parts that differ from the aforementioned embodiment. Note that, in the other embodiments and modified examples as well, advantageous effects similar to those of the first embodiment provided above can be obtained.

Modified Example 1

The display device DSP of Modified Example 1 is different from the display device DSP of the above-described first embodiment in the configuration of the light-shielding layer LS.

Figure 5:
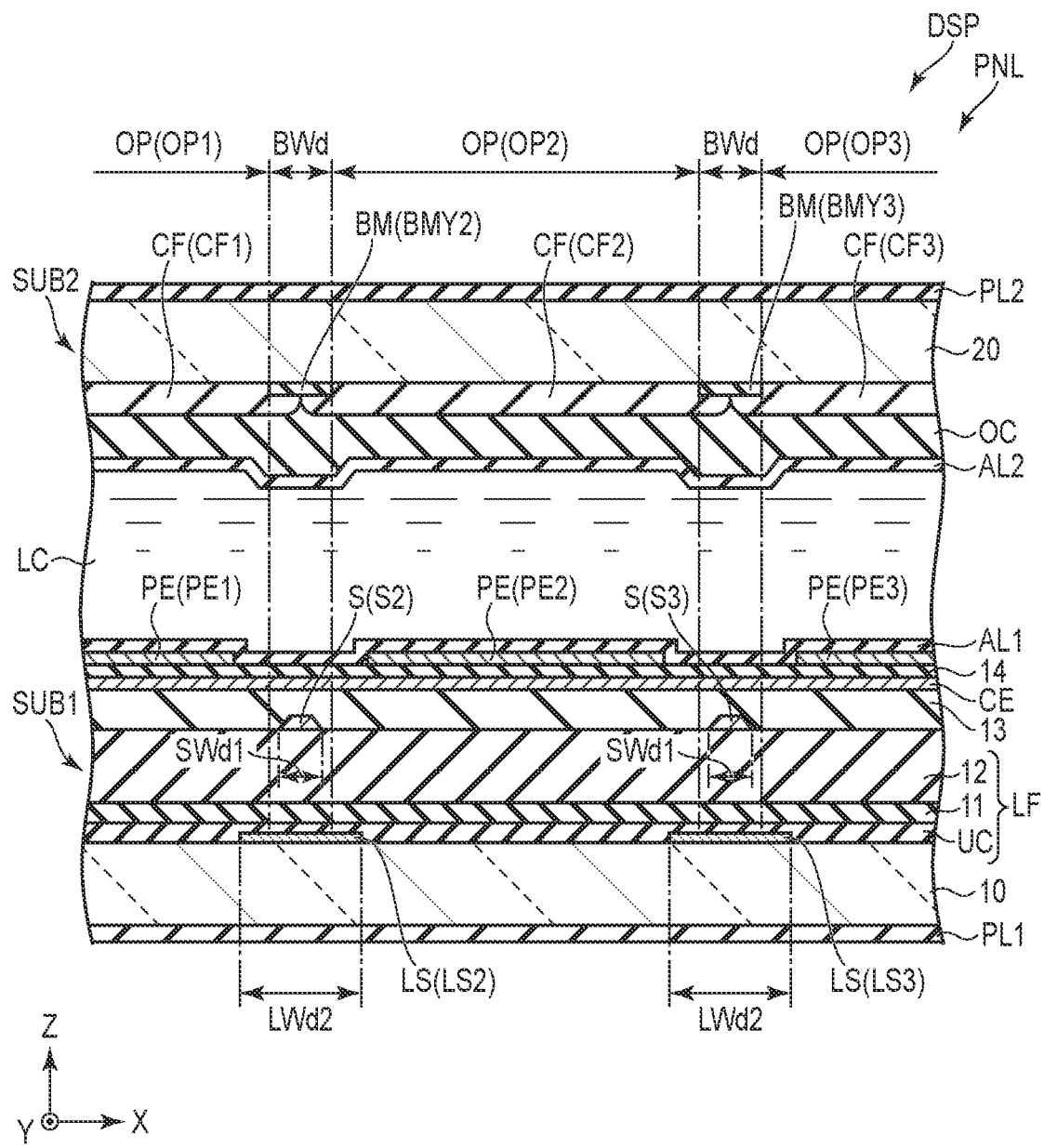
FIG. 5 is a cross-sectional view of an example of a display panel according to a modified example 1.

FIG. 5 is a cross-sectional view showing an example of the display panel PNL according to Modified Example 1.

The horizontal width LWd2 of the light-shielding layers LS (LS2 and LS3) is greater than the horizontal width BWd of the light-shielding layers BM. For example, the horizontal width LWd2 of the light-shielding layers LS (LS2 and LS3) is greater than twice the horizontal width BWd of the light-shielding layers BM. For example, the horizontal width LWd2 of the light-shielding layers LS is 9.0 μm. The light-shielding layer LS extends toward the opening OP side further from the source lines S and the light-shielding layers BM along the first direction X. For example, the light-shielding layer LS2 extends in the first direction X toward the opening OP1 side further than the source line S2 and the light-shielding layer (longitudinal portion) BMY2 and also toward the opening OP2 side further than the source line S3 and the light-shielding layer (longitudinal portion) BMY3. The light-shielding layer LS3 extends in the first direction X toward the opening OP2 side further than the source line S2 and the light-shielding layer (longitudinal portion) BMY2 and also toward the opening OP3 side further than the source line S3 and the light-shielding layer (longitudinal portion) BMY3.

Modified Example 1 with such a structure as well exhibits advantageous effects similar to those of the first embodiment. In addition, the light-shielding layer LS with the horizontal width LWd2 of the display device DSP of Modified example 1 can improve the shielding of light emitted from the illumination device BL, for example, more effectively than the shielding layer LS with the horizontal width LWd1 of the display device DSP of the first embodiment.

Second Embodiment

A display device DSP of the second embodiment is different from the display device DSP of the above-provided first embodiment and Modified Example 1 in the configuration of the first substrate SUB1.

Figure 6:
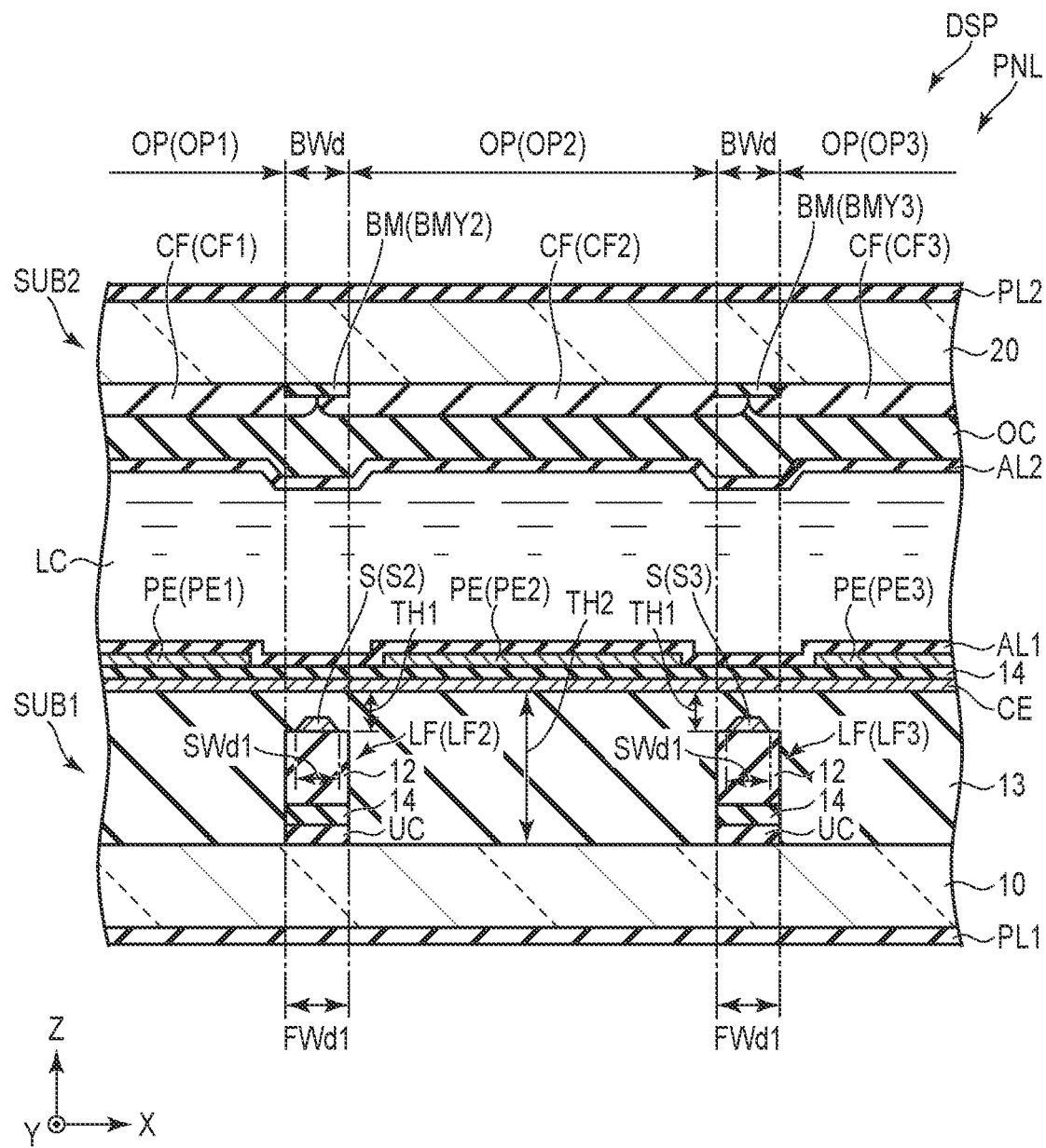
FIG. 6 is a cross-sectional view of an example of a display panel according to the second embodiment.

FIG. 6 is a cross-sectional view of an example of a display panel PNL according to the second embodiment.

The first substrate SUB1 comprises an insulating substrate 10, stacked layer films LF, insulating layers 13 and 14, source lines S (S2 and S3), a common electrode CE, pixel electrodes PE (PE1, PE2 and PE3), light-shielding layers LS (LS2 and LS3), an alignment film AL1 and the like.

The stacked layer films LF are located above the insulating substrate 10. At least a part of the portion of each stacked layer film LF, which opposes the opening OP, is removed. The stacked layer films LF are spaced apart from each other so that the openings OP overlap the insulating substrate 10 without the stacked layer films LF intervened therebetween. In other words, the stacked layer films LF are arranged in an island-like fashion so that the openings OP overlap the insulating substrate 10 without the stacked layers film LF intervened therebetween. In the example illustrated in FIG. 6, the stacked layer films LF include stacked layer films LF2 and LF3. The stacked layer films LF2 and LF3 are located on the insulating substrate 10 so as to be spaced apart from each other along the first direction X. In the portion between the stacked layer films LF2 and LF3, the opening OP2 overlaps the insulating substrate 10 without the stacked layer films LF2 and LF3 intervened therebetween. The stacked layer films LF are located directly under the source lines S and the light-shielding layers BM, respectively. In the example illustrated in FIG. 6, the stacked layer film LF2 is located directly under the source line S2 and the light-shielding layer BMY2. The stacked layer film LF3 is located directly under the source line S3 and the light-shielding layer BMY3. The stacked layer films LF overlap the source lines S and the light-shielding layers BM, respectively. In other words, the stacked layer films LF oppose the source lines S and the light-shielding layers BM, respectively. In the example illustrated in FIG. 6, the stacked layer film LF2 overlaps the source line S2 and the light-shielding layer BMY2, and the stacked layer film LF3 overlaps the source line S3 and the light-shielding layer BMY3. In other words, the stacked layer film LF2 opposes the source line S2 and the light-shielding layer BMY2, and the stacked layer film LF3 opposes the source line S3 and the light-shielding layer BMY3. The horizontal width FWd1 of the stacked layer films LF is greater than or equal to the horizontal width SWd1 of the source lines S. Note that the horizontal width FWd1 of the stacked layer films LF may be less than or equal to the width BWd of the light-shielding layers BM. For example, the horizontal width FWd1 of the stacked layer film LF along the first direction X is 5.0 μm. That is, for example, the horizontal width FWd1 of the stacked layer film LF along the first direction X is the same as the horizontal width BWd of the light-shielding layer BMY along the first direction X. Note that the width of the stacked layer film LF2 and the width of the stacked layer film LF3 may be different from each other. The stacked layers film LF do not overlap the pixel electrodes PE. In the example illustrated in FIG. 6, the stacked layer film LF2 does not overlap the pixel electrode PE1 or PE2. The stacked layer film LF3 does not overlap the pixel electrode PE2 or PE3. Note that the stacked layer films LF may overlap the pixel electrodes PE. In the example illustrated in FIG. 6, the stacked layer film LF2 may overlap the pixel electrodes PE1 and PE2. The stacked layer film LF3 may overlap the pixel electrodes PE2 and PE3. The stacked layer films LF do not overlap the openings OP. In the example illustrated in FIG. 6, the stacked layer film LF2 does not overlap the opening OP1 or OP2. The stacked layer film LF3 does not overlap the opening OP2 or OP3. Note that the stacked layer films LF may overlap the openings OP. In the example illustrated in FIG. 6, the stacked layer film LF2 may overlap the openings OP1 and OP2. The stacked layer film LF3 may overlap the openings OP2 and OP3. For example, the stacked layer films LF each may be constituted by multiple layers with different refractive indices. In the example illustrated in FIG. 6, the stacked layer films LF are each constituted by stacking three layers, namely, the undercoat layer UC, the insulating layer 11 and the insulating layer 12 one on another in the order described. The stacked layer films LF each may be constituted by four or more layers stacked one on another.

The insulating layer 13 is located on the insulating substrate 10, the stacked layer films LF and the source lines S. In other words, the insulating layer 13 is located on the insulating substrate 10 and covers the stacked layer films LF and the source lines S. The insulating layer 13 is in contact with side surfaces of the stacked layer films LF. In the example illustrated in FIG. 6, the insulating layer 13 is in contact with the side surfaces of each of the stacked layer films LF2 and LF3. The insulating layer 13 is in contact with the insulating substrate 10 between the stacked layer films LF2 and LF3. The insulating layer 13 is located between the stacked layer films LF2 and LF3 along the first direction X. A thickness TH1 of a portion of the insulating layer 13, which corresponds to the stacked layer films LF (LF2 and LF3) or the source lines S (S2 and S3) is less than a thickness TH2 of a portion of the insulating layer 13, which corresponds to the portion where the stacked layer films LF are removed, that is, for example, the portion between the stacked layer films LF2 and LF3 along the first direction X. In other words, the thickness TH2 of the insulating layer 13 is greater than the thickness TH1 of the insulating layer 13.

The source lines S (S2 and S3) are located on the stacked layer films LF, respectively. In other words, the source lines S are located between the stacked layer films LF and the insulating layer 13, respectively. In the example illustrated in FIG. 6, the source line S2 is located on the stacked layer film LF2 and the source line S3 is located on the stacked layer film LF3. The source line S2 overlaps the stacked layer film LF2 and the source line S3 overlaps the stacked layer film LF3. In other words, the source line S2 is located between the stacked layer film LF2 and the insulating layer 13, and the source line S3 is located between the stacked layer film LF3 and the insulating layer 13.

Figure 7:
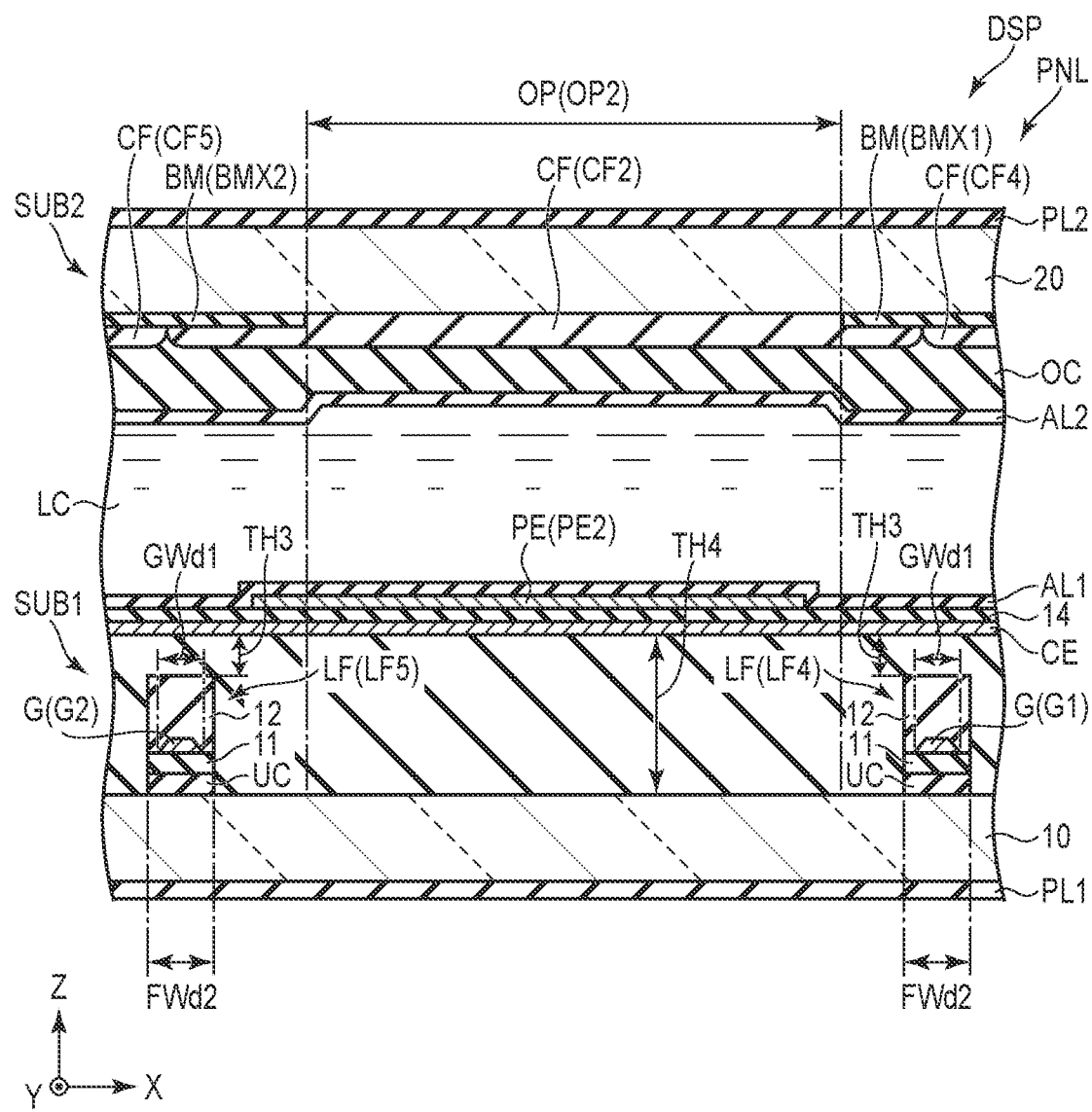
FIG. 7 is a cross-sectional view of an example of a display panel according to the second embodiment.

FIG. 7 is a cross-sectional view showing an example of a display panel PNL according to the second embodiment.

In the example illustrated in FIG. 7, the stacked layer films LF include stacked layer films LF4 and LF5. The stacked layer films LF4 and LF5 are located on the insulating substrate 10 so as to be spaced apart from each other along the second direction Y. In the portion between the stacked layer films LF4 and LF5, the opening OP2 overlaps the insulating substrate 10 without the stacked layer films LF4 and LF5 intervened therebetween. The stacked layer films LF are located directly under the gate lines G and the light-shielding layers BM, respectively. In the example illustrated in FIG. 7, the stacked layer film LF4 is located directly under the gate line G1 and the light-shielding layer (horizontal portion) BMX1. The stacked layer film LF5 is located directly under the gate line G2 and the light-shielding layer (horizontal portion) BMX2. The stacked layer films LF overlap the gate lines G and the light-shielding layers BM, respectively. In other words, the stacked layer films LF oppose the gate lines G and the light-shielding layers BM, respectively. In the example illustrated in FIG. 7, the stacked layer film LF4 overlaps the gate line G1 and the light-shielding layer (horizontal portion) BMX1, and the stacked layer film LF5 overlaps the gate line G2 and the light-shielding layer (horizontal portion) BMX2. In other words, the stacked layer film LF4 opposes the gate line G1 and the light-shielding layer (horizontal portion) BMX1, and the stacked layer film LF5 opposes the gate line G2 and the light-shielding layer (horizontal portion) BMX2. The longitudinal width FWd2 of the stacked layer films LF is greater than or equal to the longitudinal width GWd1 of the gate lines G and less than or equal to the longitudinal width of the light-shielding layers (horizontal portion) BM (BMX). Note that the longitudinal width FWd2 of the stacked layer films LF may be greater than or equal to the longitudinal width of the light-shielding layer (horizontal portion) BM (BMX). Note that the longitudinal width of the stacked layer film LF4 and the longitudinal width of the stacked layer film LF5 may be different from each other. In the example illustrated in FIG. 7, the stacked layer films LF4 and LF5 do not overlap the pixel electrodes PE, respectively. Note that the stacked layer films LF4 and LF5 may overlap the pixel electrodes PE, respectively. In the example illustrated in FIG. 7, the stacked layer films LF4 and LF5 do not overlap the openings OP, respectively. Note that the stacked layer films LF4 and LF5 may overlap the openings OP2, respectively.

The insulating layer 13 is located on the insulating substrate 10 and the stacked layer films LF. In other words, the insulating layer 13 is located on the insulating substrate 10 and covers the stacked layer films LF and the gate lines G. In the example illustrated in FIG. 7, the insulating layer 13 is in contact with side surfaces of each of the stacked layer films LF4 and LF5. The insulating layer 13 is in contact with the insulating substrate 10 between the stacked layer films LF4 and LF5. The insulating layer 13 is located between the stacked layer films LF4 and LF5 along the second direction Y. A thickness TH3 of a portion of the insulating layer 13, which corresponds to the stacked layer films LF (LF4 and LF5) or the gate lines G (G1 and G2) is less than a thickness TH4 of a portion of the insulating layer 13, which corresponds to the portion where the stacked layer films LF are removed, for example, the portion between the stacked layer films LF4 and LF5 along the second direction Y. In other words, the thickness TH4 of the insulating layer 13 is greater than the thickness TH3 of the insulating layer 13.

The gate lines G (G1 and G2) are each located in the stacked layer films LF. The gate lines G (G1 and G2) are located above the undercoat layer UC. In other words, the gate lines G (G1 and G2) are located between the undercoat layers UC and the insulating layers 11, respectively. The gate lines G1 and G2 are located above the insulating layer 11 so as to be spaced apart from each other along the second direction Y. In the example illustrated in FIG. 7, the gate line G1 is located in the stacked layer film LF4 and the gate line G2 is located in the stacked layer film LF5. In other words, the gate lines G are located between the insulating layers 11 and 12 of the stacked layer film LF4 and between the insulating layers 11 and 12 of the stacked layer film LF5. The longitudinal width GWd1 of the gate lines G (G1 and G2) along the second direction Y is less than or equal to the longitudinal width FWd2 of the stacked layer film LF (LF4 and LF5) along the second direction Y. The longitudinal widths of the gate lines G2 and G3 along the second direction Y may be different from each other.

A method of manufacturing the display device DSP of the second embodiment will now be described with reference to FIGS. 8 and 9.

Figure 8:
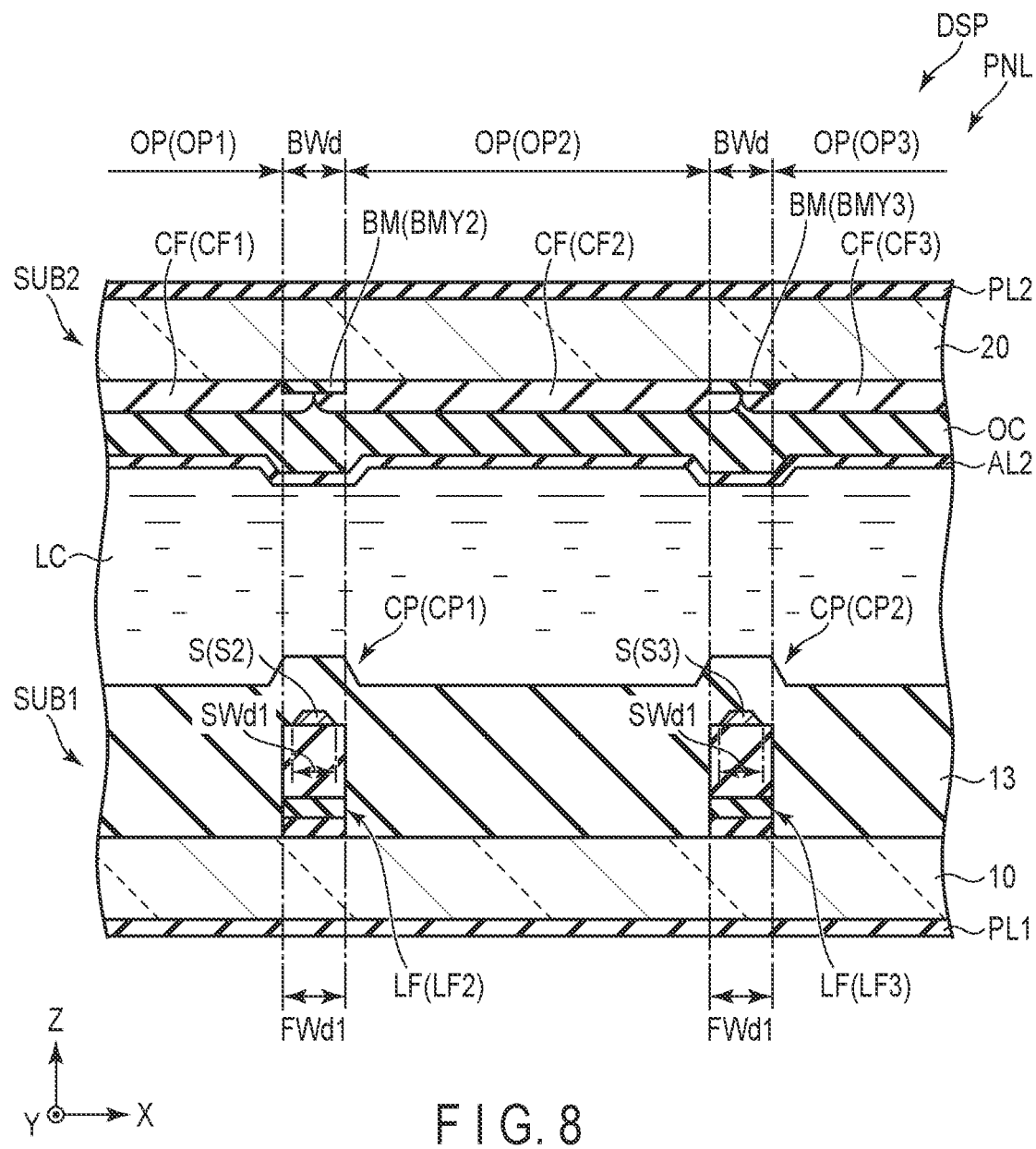
FIG. 8 is a cross-sectional view showing an example of a manufacturing process for an insulating layer of a first substrate of the display device according to the second embodiment.
Figure 9:
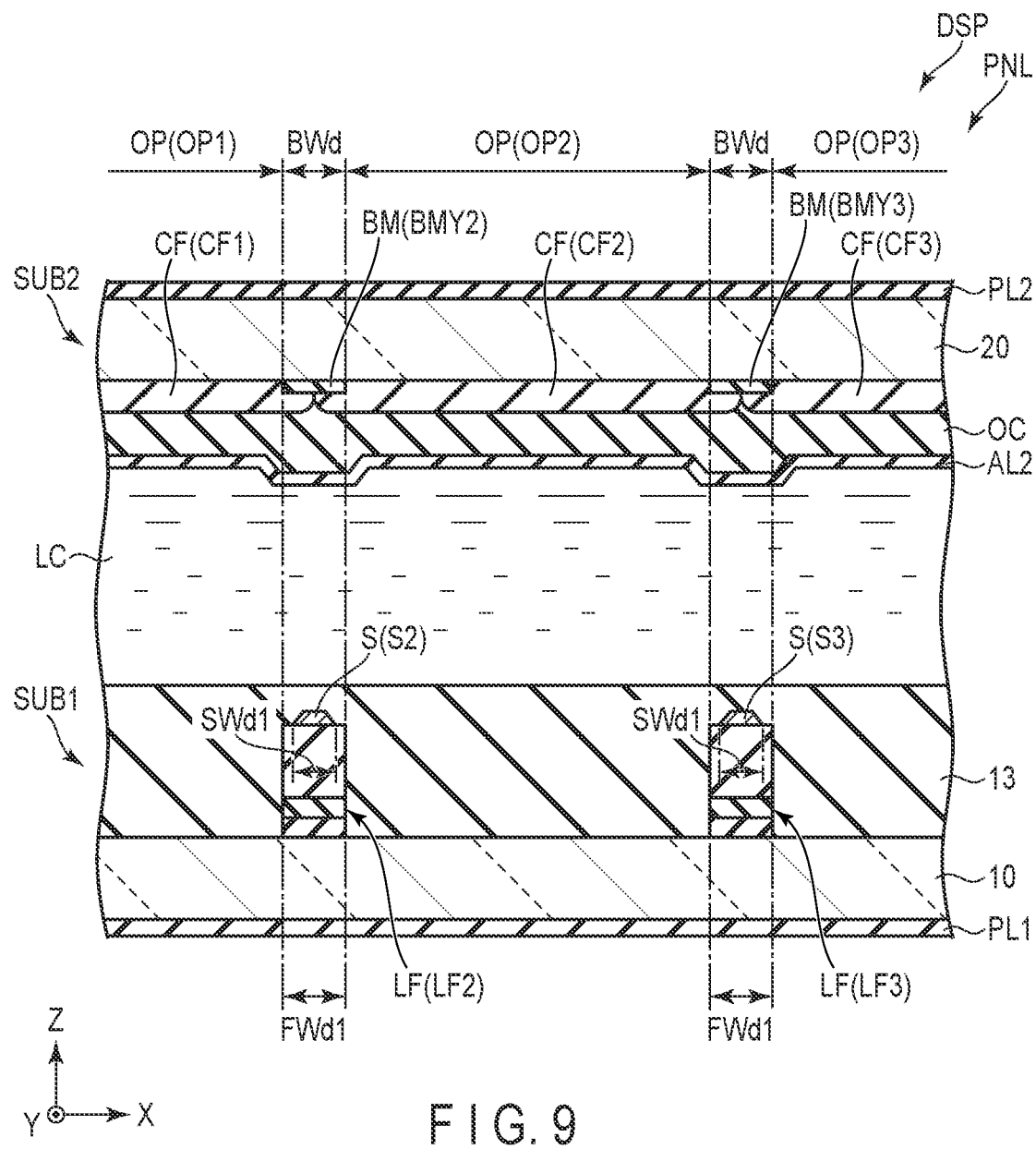
FIG. 9 is a cross-sectional view showing an example of the manufacturing process for the insulating layer of the first substrate of the display device according to the second embodiment.

FIGS. 8 and 9 each are a cross-sectional view showing an example of each of manufacturing processes of the insulating layer 13 of the first substrate SUB1 of the display device DSP according to the second embodiment.

As shown in FIG. 8, the stacked layer films LF2 and LF3 are formed on the insulating substrate 10. After the stacked layer films LF2 and LF3 are formed on the insulating substrate 10, the source lines S2 and S3 are placed on the stacked layer films LF2 and LF3, respectively. After the source lines S2 and S3 are placed on the stacked layer films LF2 and LF3, respectively, the insulating layer 13 is formed on the insulating substrate 10, the source lines S2 and S3, and the stacked layer films LF2 and LF3. At this time, in the insulating layer 13, a convex portion CP (CP1) protruding above from the portion where the source line S2 and the stacked layer film LF2 are formed and a convex portion CP (CP2) protruding above from the portion where the source line S3 and the stacked layer film LF3 are formed.

As shown in FIG. 9, after the insulating layer 13 is formed on the insulating substrate 10, the source lines S2 and S3 and the stacked layer films LF2 and LF3, the convex portions CP (CP1 and CP2) are removed so as to process the upper surface of the insulating layer 13 to be flat. For example, the convex portions CP1 and CP2 are removed by half-exposure and the upper surface of the insulating layer 13 is processed to be flat. For example, if the convex portions CP1 and CP2 remain, the liquid crystals can be obliquely aligned in the portions of the convex portions CP1 and CP2. But by removing the convex portions CP1 and CP2 as in this embodiment, it is possible to prevent the liquid crystals from being obliquely aligned.

According to the second embodiment, the display device DSP comprises a first substrate SUB1 and a second substrate SUB2 opposing each other and a liquid crystal layer LC held between the first substrate SUB1 and the second substrate SUB2. The first substrate SUB1 comprising an insulating substrate 10, stacked layer films LF, insulating layers 13 and 14, source lines S, a common electrode CE, pixel electrodes PE, light-shielding layers LS (LS2 and LS3), an alignment film AL1 and the like. The stacked layer films LF are located on the insulating substrate 10. The source lines S are located on the stacked layer films LF, respectively. The insulating layer 13 is located above the insulating substrate 10, the stacked layer films LF and the source lines S. In other words, the insulating layer 13 covers the insulating substrate 10, the stacked layer films LF and the source lines S. The width FWd1 of the stacked layer film LF is greater than or equal to the width BWd of the light-shielding layer BM. For example, the width FWd1 of the stacked layer film LF is 5.0 μm. That is, for example, the width FWd1 of the stacked layer films LF is the same as the width BWd of the light-shielding layers BMY. The stacked layer films LF do not overlap the pixel electrodes PE, respectively. Further, the stacked layer films LF do not overlap the openings OP, respectively. In each of the stacked layer films LF, where the refractive index differs from one layer to another, the light traveling obliquely in the display device DSP is reflected at the interface of each layer, which can stray light ray to generate. Therefore, in the display device DSP of the second embodiment, in which the stacked layer films LF are not provided except in the portions opposing the source lines S and the light-shielding layers BM, the amount of stray light ray can be reduced, and the black luminance can be reduced, thus improving the contrast. Therefore, it is possible to provide a display device which can improve the display quality.

Modified Example 2

A display device DSP of Modified example 2 according to the second embodiment is different from the display device DSP of any one of the first embodiment, the second embodiment and Modified example 1 described above in the configuration of the first substrate SUB1.

Figure 10:
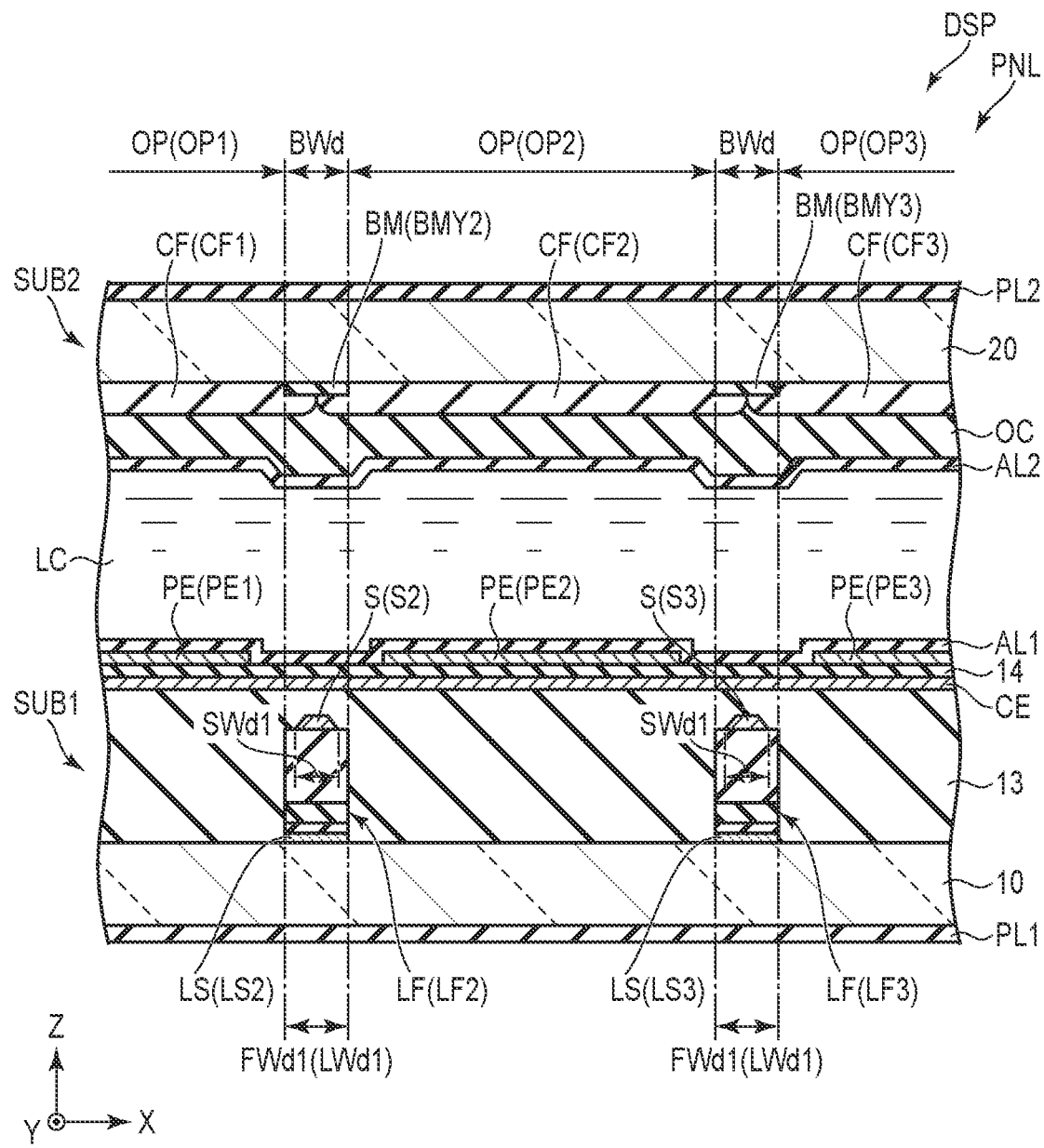
FIG. 10 is a cross-sectional view of an example of a display panel according to a modified example 2.

FIG. 10 shows a cross-sectional view of an example of a display panel PNL for Modified Example 2.

The first substrate SUB1 comprises an insulating substrate 10, stacked layer films LF, insulating layers 13 and 14, source lines S (S2 and S3), a common electrode CE, pixel electrodes PE (PE1, PE2, and PE3), light-shielding layers LS (LS2 and LS3), an alignment film AL1 and the like.

The light-shielding layers LS are located above the insulating substrate 10. In other words, the light-shielding layers LS are located between the insulating substrate 10 and the stacked layer films LF, respectively. The light-shielding layer LS2 is located directly under the light-shielding layer (longitudinal portion) BMY2, the source line S2, and the stacked layer film LF2, and the light-shielding layer LS3 is located directly under the light-shielding layer (longitudinal portion) BMY3, the source line S3 and the stacked layer film LF3. In other words, the light-shielding layer LS2 overlaps the light-shielding layer (longitudinal portion) BMY2, the source line S2 and the stacked layer film LF3, and the light-shielding layer LS3 overlaps the light-shielding layer (longitudinal portion) BMY3, the source line S3 and the stacked layer film LF3. The horizontal width LWd1 of the light-shielding layers LS (LS2 and LS3) may be less than or equal to the horizontal width FWd1 of the stacked layer films LF, or may be greater than the horizontal width FWd1 of the stacked layer films LF. In the example illustrated in FIG. 10, the horizontal width LWd1 of the light-shielding layers LS is the same as the horizontal width FWd1 of the stacked layer films LF. Note that the horizontal width LWd1 of the light-shielding layers LS may be different from the horizontal width FWd1 of the stacked layer films LF.

In Modified Example 2 with such a configuration, advantageous effects similar to those of the first and second embodiments can be obtained.

Modified Example 3

A display device DSP of Modified example 3 according to the second embodiment is different from the display device DSP of any one of the first embodiment, the second embodiment, Modified Example 1 and Modified example 2 described above in the configuration of the first substrate SUB1.

Figure 11:
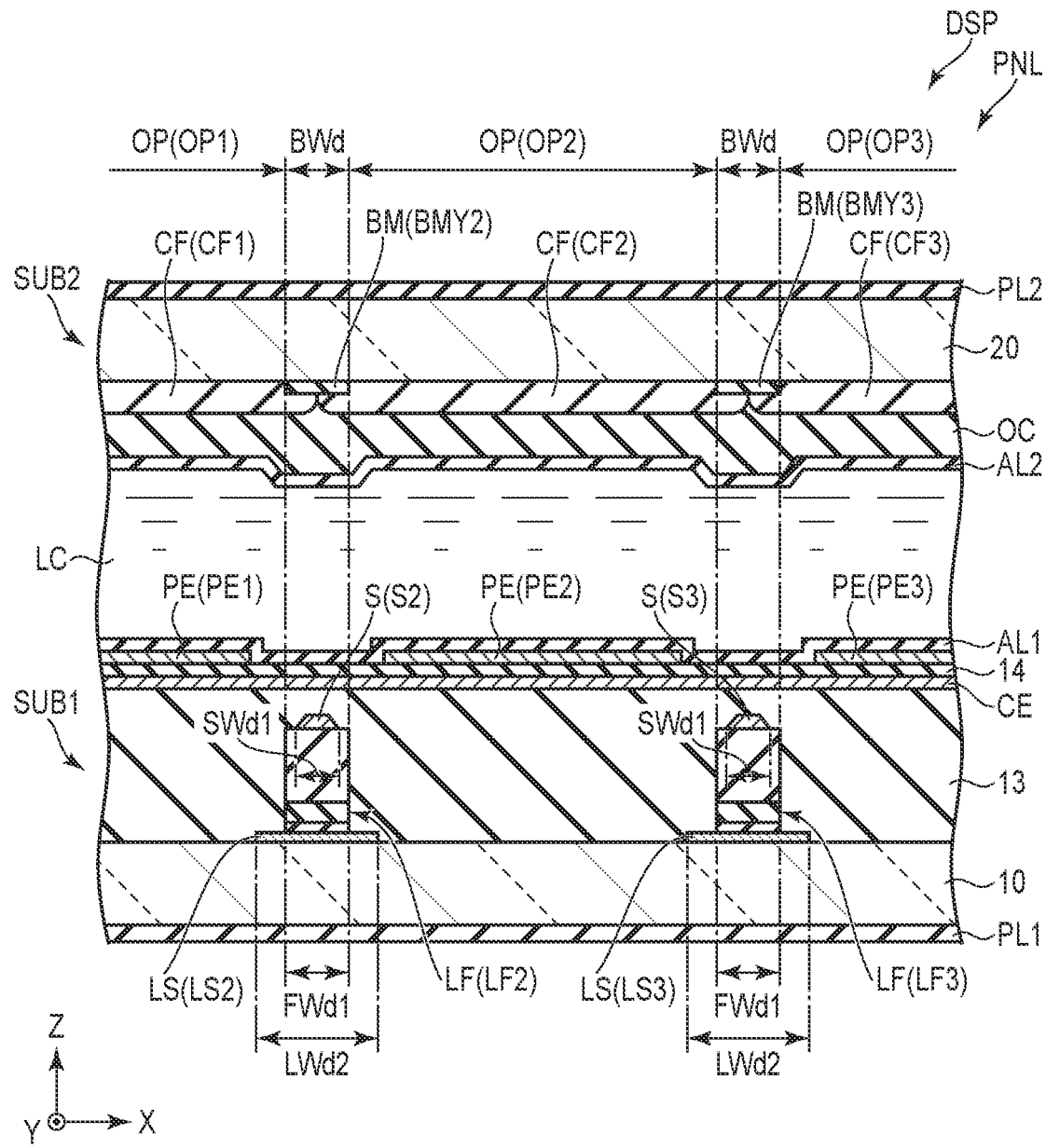
FIG. 11 is a cross-sectional view of an example of a display panel according to a modified example 3.

FIG. 11 is a cross-sectional view showing an example of the display panel PNL according to Modified Example 3.

The horizontal width LWd2 of the light-shielding layers LS (LS2 and LS3) along the first direction X is greater than the horizontal width FWd1 of the stacked layer films LF (LF2 and LF3). The light-shielding layers LS each extend toward the respective opening OP side along the first direction X further than the respective stacked layer film LF. In the example illustrated in FIG. 11, the light-shielding layer LS2 extends toward the opening OP1 side further than the stacked layer film LF2 and toward the opening OP2 side further than the stacked layer film LF2 along the first direction X. The light-shielding layer LS3 extends toward the opening OP2 side further than the stacked layer film LF3 and toward the opening OP3 side further than the stacked layer film LF3 along the first direction X.

The insulating layer 13 is located above the insulating substrate 10, the stacked layer films LF, the source lines S and the light-shielding layers LS. In other words, the insulating layer 13 covers the insulating substrate 10, the stacked layer films LF, the source lines S and the light-shielding layers LS. The insulating layer 13 is located on both end portions of each of the light-shielding layers LS. In the example illustrated in FIG. 11, the insulating layer 13 is located on both the end portions of the light-shielding layer LS2. For example, the insulating layer 13 is in contact with both end portions of the light-shielding layer LS2. The insulating layer 13 is located on both end portions of the light-shielding layer LS3. For example, the insulating layer 13 is in contact with both the end portions of the light-shielding layer LS3.

In modified example 3 with such a configuration described above, advantageous effects similar to those of the first and second embodiments can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate;
a second substrate opposing the first substrate; and
a liquid crystal layer held between the first substrate and the second substrate, wherein
the first substrate includes an insulating substrate, a first light-shielding layer and a second light-shielding layer located above the insulating substrate, a stacked layer film located above the insulating substrate, a first source line and a second source line located above the stacked layer film, and a first insulating layer located above the stacked layer film, the first source line and the second source line,
the second substrate includes a first light-shielding material and a second light-shielding material,
the first source line and the second source line are disposed to be spaced apart from each other along a first direction,
the first light-shielding material and the second light-shielding material are disposed to be spaced apart from each other along the first direction,
the first light-shielding layer overlaps the first source line and the first light-shielding material,
the second light-shielding layer overlaps the second source line and the second light-shielding material,
the stacked layer film includes a first stacked layer film and a second stacked layer film disposed to be spaced apart from each other along the first direction,
the first light-shielding layer is located between the insulating substrate and the first stacked layer film,
the second light-shielding layer is located between the insulating substrate and the second stacked layer film,
a first width of the first light-shielding layer along the first direction is equal to or greater than a second width of the first light-shielding material along the first direction, and
a third width of the second light-shielding layer along the first direction is equal to or greater than a fourth width of the second light-shielding material along the first direction.

2. The display device of claim 1, wherein
the first width is a same as the second width, and
the third width is a same as the fourth width.

3. The display device of claim 1, wherein
the first width is twice or more a width of the first source line, and
the third width is twice or more a width of the second source line.

4. The display device of claim 3, wherein
the first width to the fourth width are 5.0 µm to 9.0 µm.

5. The display device of claim 1, wherein
the first width is greater than the second width, and
the third width is greater than the fourth width.

6. The display device of claim 1, wherein
a first thickness of the first insulating layer located above the first stacked layer film and the second stacked layer film is less than a second thickness of the first insulating layer between the first stacked layer film and the second stacked layer film.

7. The display device of claim 6, wherein
the first insulating layer is in contact with the insulating substrate between the first stacked layer film and the second stacked layer film.

8. The display device of claim 1, wherein
the first substrate includes a first gate line and a second gate line located in the stacked layer film,
the stacked layer film includes a third stacked layer film and a fourth stacked layer film disposed to be spaced apart from each other along a second direction that intersects the first direction,
the first gate line is located in the third stacked layer film, and
the second gate line is located in the fourth stacked layer film.

9. The display device of claim 8, wherein
a third thickness of the first insulating layer located above the third stacked layer film and the fourth stacked layer film is less than a fourth thickness of the first insulating layer between the third stacked layer film and the fourth stacked layer film.

10. The display device of claim 8, wherein
the first insulating layer is in contact with the insulating substrate between the third stacked layer film and the fourth stacked layer film.

11. A display device comprising:
a first substrate;
a second substrate opposing the first substrate; and
a liquid crystal layer held between the first substrate and the second substrate, wherein
the first substrate includes an insulating substrate, a first light-shielding layer and a second light-shielding layer located above the insulating substrate, a first stacked layer film and a second stacked layer film located above the insulating substrate, a first source line located above the first stacked layer film, a second source line located above the second stacked layer film, and a first insulating layer located above the first stacked layer film, the second stacked layer film, the first source line, and the second source line,
the second substrate includes a first light-shielding material and a second light-shielding material,
the first stacked layer film and the second stacked layer film are disposed to be spaced apart from each other along a first direction,
the first light-shielding layer is located between the insulating substrate and the first stacked layer film,
the second light-shielding layer is located between the insulating substrate and the second stacked layer film, the first light-shielding material and the second light-shielding material are disposed to be spaced apart from each other along the first direction,
the first stacked layer film overlaps the first source line and the first light-shielding material, and
the second stacked layer film overlaps the second source line and the second light-shielding material.

* * * * *